United States Patent [19]
Lee et al.

[11] Patent Number: 5,781,009
[45] Date of Patent: Jul. 14, 1998

[54] TWO-COIL APPARATUS FOR MEASURING THE ABSOLUTE VALUE OF MAGNETIC PENETRATION DEPTH λ OF SUPERCONDUCTOR FILMS

[75] Inventors: JuYoung Lee; Sang Sam Choi, both of Seoul; Taek-Sang Hahn, Kyungki-Do, all of Rep. of Korea

[73] Assignee: Korea Institute of Science and Technology, Seoul, Rep. of Korea

[21] Appl. No.: 720,195

[22] Filed: Sep. 25, 1996

[30] Foreign Application Priority Data

Oct. 2, 1995 [KR] Rep. of Korea ............... 1995 33693

[51] Int. Cl.$^6$ ..................... G01R 33/035; G01R 33/12
[52] U.S. Cl. ..................... 324/239; 505/726; 324/654
[58] Field of Search ..................... 324/239, 248, 324/654, 71.6; 505/160, 310, 726, 842

[56] References Cited

PUBLICATIONS

"Penetration depth in YBa$_2$Cu$_3$O$_{7-\delta}$ thin films from far-infrared transmission," L.A. de Vaulchier, et al., *Physical Review B*, vol. 52, No. 1, Jul. 1995, polygon.564–569.

"Penetration depths of High T$_c$ films measured by two coil mutual inductances," A.T. Fiory, et al., *Applied Physics Letters*, vol. 52, No. 25, Jun. 1988, polygon.2165–2167.

"Magnetic penetration depth in Ni–and Zn–doped YBa$_2$(Cu$_{1-x}$M$_x$)$_3$O$_7$ films," E.R. Ulm, et al., *Physical Review B*, vol.51, No. 14, Apr. 1995, polygon, 9193–9198.

"Observation of the superconducting proximity effect from kinetic–inductance measurements," J.H. Claassen, et al, *Physical Review B*, vol.44, No. 17, Nov. 1991, polygon 9605–9608.

"Magnetic field penetration through a superconducting film.: A.B. Pipard, Superconductor Science and Technology", vol. 7, 1994, polygon. 696–699.

"Determining the absolute value of penetration depth in large area superconductor films" J.Y. Lee, et al., submitted to Applied Physics Letters.

*Primary Examiner*—Walter E. Snow
*Attorney, Agent, or Firm*—Scully, Scott, Murphy & Presser

[57] ABSTRACT

An improved two-coil apparatus for measuring the absolute value of magnetic penetration depth λ of superconductor films which is capable of measuring the absolute value of magnetic penetration depth which is denoted as λ of a large area high temperature superconductor film using a low frequency or a static weak magnetic field, which includes a drive coil that is designed to suppresses the screening current of the film at the film edge a receive coil opposingly spaced-apart from the drive coil; sample holders disposed at the left-and right-sides of the receive coil; a large area low temperature superconductor film attached on the sample holder between the drive coil and the receive coil; and a large area high temperature superconductor film mounted on the large area low temperature superconductor film between the drive coil and the receive coil.

10 Claims, 5 Drawing Sheets

TWO-COIL APPARATUS FOR MEASURING THE ABSOLUTE VALUE OF MAGNETIC PENETRATION DEPTH λ OF SUPERCONDUCTOR FILMS

BACKGROUND OF THE INVENTION

1. Field of the Invention

The present invention relates a two-coil apparatus for measuring the absolute value of magnetic penetration depth λ of a superconductor film, and in particular to an improved two-coil apparatus for measuring the absolute value of magnetic penetration depth λ of a superconductor film which is capable of measuring the absolute value of magnetic penetration depth which is denoted as λ in the large area superconductor film using a low frequency or a static weak magnetic field.

2. Description of the Conventional Art

The magnetic penetration depth λ of superconductor is equivalent to the skin depth of superconducting material and is almost fixed from DC to several tens of giga hertz whereas that of a normal metal is inversely proportional to square root of frequency. Due to rapid expansion of the wireless telecommunication market, application of the HTS (high temperature superconductor) film to the microwave filter for the base station will become a reality in the near future and commercialization of HTS is expected to be achieved initially in this field. Therefore, the magnetic penetration depth λ is an essential factor for designing microwave passive devices which utilize HTS film as exemplified by the fact that computer simulation requires the value of λ and that the thickness of HTS film must be sufficiently larger than the λ. Furthermore, for the reason that the kinetic inductance increases as the dimension of the device decreases, the knowledge of the absolute size of λ becomes more significant in the designing of Josephson junction-related devices such as transistor and RSFQ (rapid single flux quantum) that are composed of HTS film. These are regarded as the devices of next generation due to their fast signal propagation capability which is in the order of the speed of light. Once the large area HTS film reaches the stage of mass production, demand for the data of λ is expected to increase accordingly. Therefore it is valuable to devise an apparatus that can nondestructively measure the absolute size of λ of a large area HTS film so that only the films that meet the required spec are preselected before any modification of the film is made for device fabrication.

Recently a method that can measure the absolute λ with far-infrared transmission was reported. [Refer to: L. A. de Vaulchier et al., *Phys. Rev.* B, vol. 52, 564–569 (1995)] However, it had a disadvantage of requiring operation of far-infrared equipments. Achieving the same goal with low frequency or DC magnetic field would be a better alternative since the apparatus will be much simpler to make and to use. The two-coil method devised by Fiory et al. uses low frequency AC magnetic field (about 10 kHz) and consequently is preferred for this purpose [Refer to: A. T. Fiory et al., *Appl. Phys. Lett.*, vol. 52, 2165–2167(1988)]. In the two-coil configuration which is composed of drive coil, receive coil and a superconducting film located in the gap between the two coils, the magnetic filed generated as current $I_d$ applied to drive coil is mostly blocked by the film. Only a tiny fraction of the field actually passes through the superconducting film and gives rise to an AC voltage at receive coil in proportion to the rate of magnetic flux in receive coil. In the measured AC voltage, however, there always is a background of constant amplitude that originates from two sources: the stray coupling between the drive coil and receive coil via the magnetic field that goes around the film edge and the stray magnetic coupling between the leads attached to the drive coil and receive coil [Refer to: J. H. Claasen et al., *Phys. Rev.* B, vol. 44, 9605–9608 (1991)]. Since the error in the background can be larger than the measured signal, the conventional -two-coil method of Fiory et al. fails to determine the absolute value of λ and is only sensitive to the change of λ.

There is a recent report that measured the size of background by the following procedure. A 0.15 mm thick lead foil is placed between the drive coil and receive coil. Voltage at receive coil is measured when the lead foil is superconducting. The foil is then removed and the sample film to be measured is mounted. [Refer to: E. R. Ulm et al., *Phys. Rev.* B vol.51, 9193–9198(1995)] Since the superconducting lead foil is completely blocking the magnetic field, the measured voltage with the superconducting lead foil constitutes the background signal for this apparatus. This voltage is subtracted from the voltage measured with the sample film and the resultant value leads to an absolute value of λ. However, during a procedure such as this, the sample holder has to be opened and closed to swab the lead foil and the sample film. Unless a precise mechanical control is made, the stray magnetic coupling between the leads attached to drive coil and receive coil may change due to the mechanical change of the leads attached to coils during the swab. As result, the backgrounds for lead foil and for YBCO film sample can be different due to the shift of the background during the swab.

Another drawback of the conventional two-coil method is the peak in the screening current at the film edge caused by the finite size of the film. This edge current peak causes error in the conversion of measured voltage into the absolute value of λ and also causes the measured voltage to be sensitive to the film size and the transverse location of films relative to coil axis unless the film is much larger than the coils. Consequently, the present invention aims at an improved version of the two-coil apparatus by removal of the edge current.

SUMMARY OF THE INVENTION

Accordingly, it is an object of the present invention to provide a two-coil apparatus for measuring the absolute value of magnetic penetration depth λ of superconductor films, which overcomes the problems encountered in the conventional art.

It is another object of the present invention to provide an improved two-coil apparatus for measuring the absolute value of magnetic penetration depth λ of superconductor films which is capable of measuring the absolute value of magnetic penetration depth which is denoted as λ in the large area superconductor film using a low frequency or a static weak magnetic field.

It is another object of the present invention to provide an improved two-coil apparatus for measuring the absolute value of magnetic penetration depth λ of superconductor films which is basically directed to devise an apparatus that would provide measurements of both the background and the sample film with just one run so that separate swabbing of the lead film and the sample film is unnecessary and secondly where the edge current is minimized. The first goal of the present invention is accomplished by placing a lead or niobium film that has lower transition temperature ($T_c$) than the sample film. Once it is placed face to face with a sample film, scanning the temperature around the $T_c$ of lead film is done. The second goal is achieved by designing the drive coil to be the at the superposition of the dipole coil and quadruple coil component in optimum proportion. The advantage and essence of the present invention will become clear from the following description of the invention.

To achieve the above objects, there is provided a twocoil apparatus for measuring the absolute value of magnetic penetration depth $\lambda$ of superconductor films which includes a drive coil; a receive coil opposingly spaced-apart from the drive coil; sample holders disposed at the left-and rightsides of the receive coil; a large area low temperature superconductor film attached on the sample holder between the drive coil and the receive coil; and a large area high temperature superconductor film attached on the large area low temperature superconductor film between the drive coil and the detection coil.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 3A and 3B are views showing spatial distribution of a screening current density Js at a superconductor film, of which:

FIG. 3A is a graph showing a screening current density Js when a drive coil, in which a quadruple coil component and dipole coil component are combined in the twocoil apparatus of FIG. 1, is adapted according to the present invention; and FIG. 3B is a graph showing a screening current density Js when a quadruple coil is adopted as a drive coil of the two-coil apparatus of FIG. 1 according to the present invention.

DETAILED DESCRIPTION OF THE INVENTION

Figure 1A:
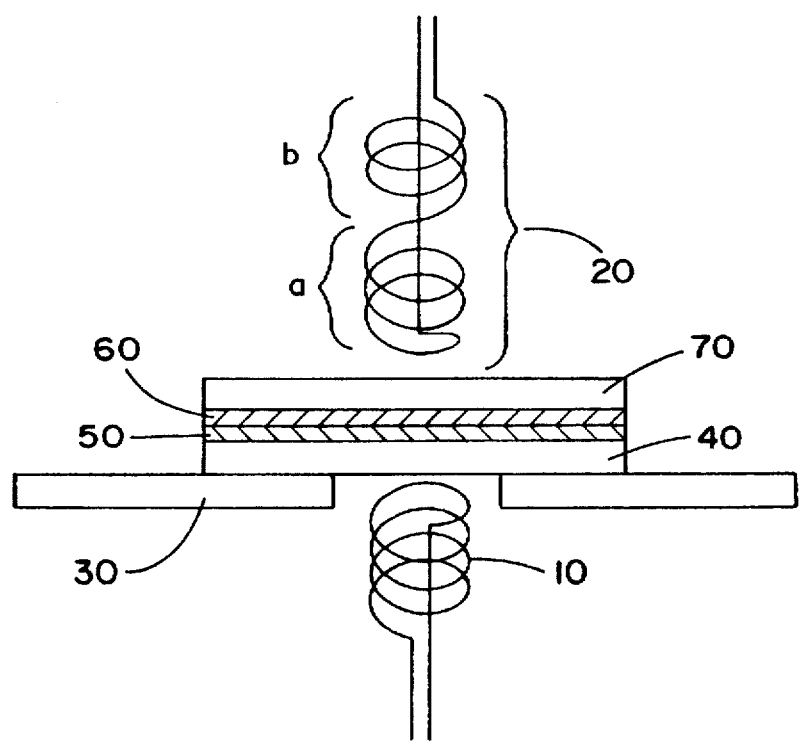
FIG. 1A is a schematic diagram of the construction of magnetic penetration depth measuring apparatus according to the present invention.

The apparatus that can measure the absolute value of the magnetic penetration depth $\lambda$ of a large area HTS film is explained in detail with reference to the schematic diagrams and empirical data. As shown in FIG. 1A, the two-coil apparatus of the present invention includes a receive coil 10 disposed at a predetermined position opposed to a drive coil 20, sample holders 30 disposed at the left/right sides of the receive coil 10, a Pb thin film 50, which is referred to the large area low temperature superconductor (LTS), disposed on the sample holder 30 between the drive coil 20 and the receive coil 10, and a YBCO thin film 60 attached on the large area LTS thin film 50, which is referred to the sample thin film. Here, in the drawings, reference numeral 40 denotes a Pb thin film substrate on which the Pb thin film is deposited, and reference numeral 60 denotes a YBCO substrate on which the YBCO thin film is deposited.

Namely, the above-mentioned two-coil apparatus is directed to a construction in which the Pb thin film 50, which is referred to the large area LTS thin film, is attached on the sample holder 30 of the two-coil apparatus in a form that the Pb thin film 50 is overlapped with the YBCO thin film 60.

A large area lead film 50 is placed on the sample holder 30 of the apparatus as shown in FIG. 1A to overlap with the sample film (YBCO film 60 in FIG. 1A). Here, any film with lower $T_c$ than the sample film 60 can be substituted for the lead film, i.e., niobium or HTS film, and in this invention, the lead film 50 is used since its $T_c$ is lower than that of the YBCO film 60. The lead film 50 of FIG.1A should completely block the magnetic field generated by the drive coil (20) current $I_d$ when it is superconducting but be transparent to magnetic field when it is in the normal state. The thickness of the lead film 50 of FIG.1A fulfills the requirement of being larger than 5 $\lambda$ but much smaller than the normal metal state skin depth (less than about $\frac{1}{100}$ of ) in order for the lead film 50 to have the previously mentioned function.

When the above condition is satisfied, the superconducting lead film 50 will be thick enough to completely block the magnetic field and normal metal lead film 50 will be thin enough to ignore its effect on magnetic field. When the lead film 50 is in the superconducting state, the measured voltage is equivalent to the background signal since the field penetration through the films is at zero as a result of screening of the superconducting lead film 50. Once lead film 50 is in the normal state, its presence is negligible and the measuring voltage is only dictated by the superconducting YBCO film 60 only. The transition of lead film between the superconducting and normal metal state is purely thermal. Since the transition is controlled only by a slight temperature scan near $T_c$ of lead film, no mechanical manipulation is involved in the measurement.

Figure 2:
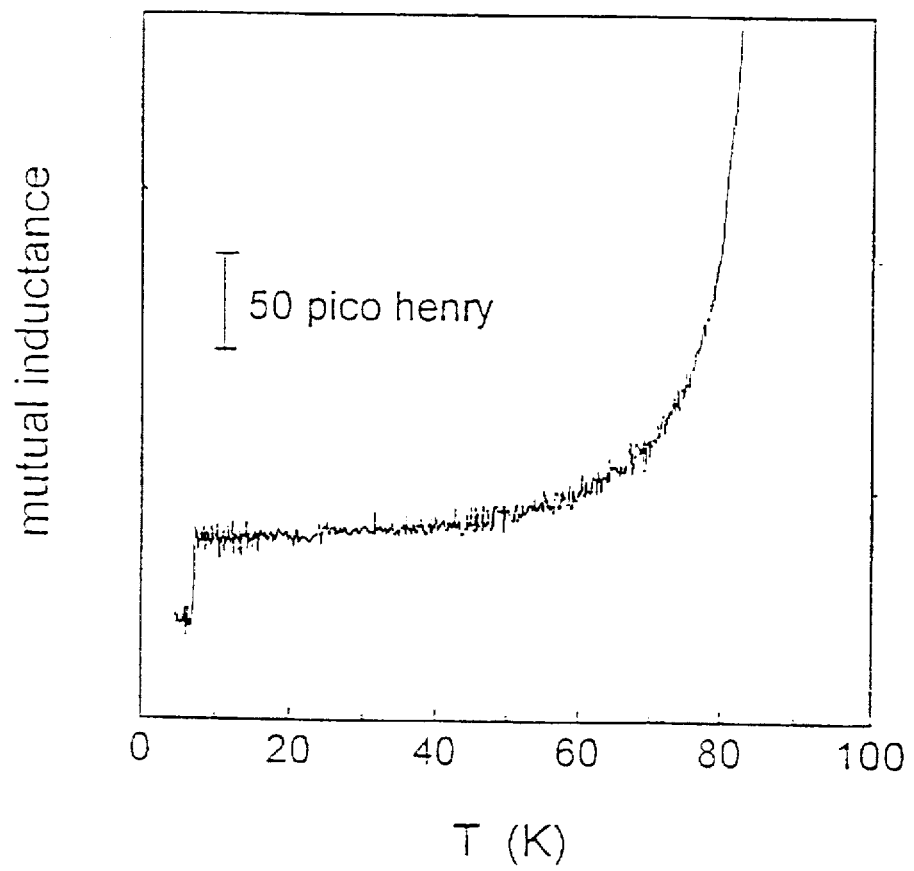
FIG. 2 is a graph showing a mutual inductance data obtained with the apparatus of FIG. 1 according to the present invention.

FIG. 2 illustrates data obtained from the application of the present invention. The vertical axis of FIG. 2 represents a mutual inductance M of two coils given by $M = V_r / (I_d 2\pi f)$, where $V_r$ is AC voltage at receive coil and f is the frequency of $I_d$ which is 10 kHz for this example. The horizontal axis represents temperature. The step-like section of data arises from transition of the lead film 50, and it is located at 7.2K below which the lead film is in the superconducting state. The base of the step-like section is equivalent to background signal and the height of the step-like section is attributed only to the penetration depth of the YBCO film 60. The vertical segment shown in FIG. 2 amounts to 50 pico henry. The entire M vs T curve usually shifts up and downward from one measurement to another as the position of the leads attached to coils changes during the opening and closing of the sample holder 30 for mounting the sample but the height of step-like section remains intact.

In this measurement, the outer diameter of the flat coils is 3 mm, the inner diameter 1.5 mm, and the areas of both lead film 50 and YBCO film 60 are 2.2×2.2 cm². The thickness of YBCO film 60 and lead film 50 are 0.1µm and 1µm, respectively. Since the value of $\lambda$ of lead at low temperature is 830 Å and the skin depth of the Pb has a frequency of 10khz at 0.1 mm, the thickness of the Pb film is thick enough in the superconductive state, and is thin enough in the normal state. Then the lead film is coated with photoresist as a protective layer. Coil bobbins and the sample holder 30 are made of Plexiglas in order to prevent Eddy current in metal caused by 10 kHz AC magnetic field.

Figure 1B:
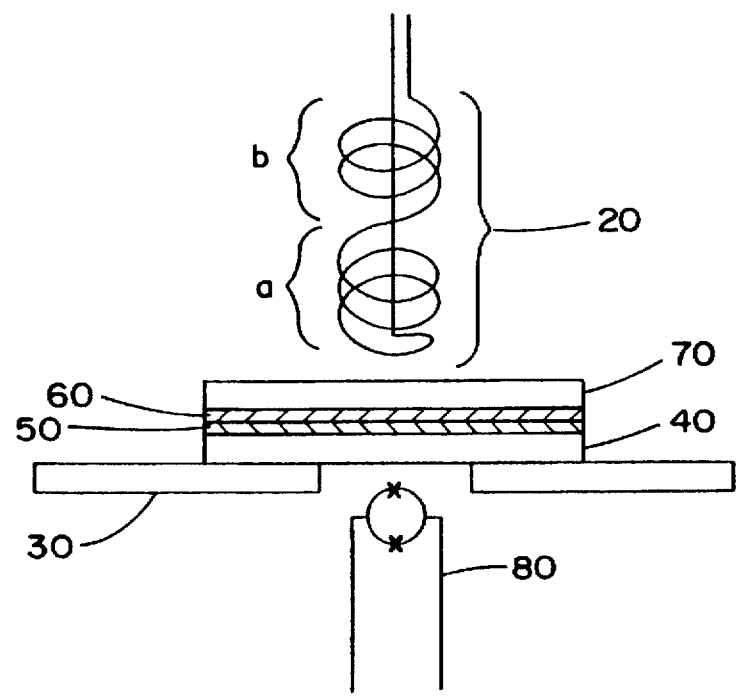
FIG. 1B is a schematic diagram of the construction of magnetic depth measuring apparatus according to an alternative embodiment of the present invention.

On the other hand, DC magnetic field can be used as an alternative to AC magnetic field if a SQUID 80 sensor is substituted with the receive coil 10 to monitor DC magnetic field as shown in FIG. 1B. In this case, the thickness of lead film is only required to be larger than 5 λ since the skin depth of normal metal state at zero frequency is infinite. The absence of Eddy current allows sample holder 30 to be made of metal which provides better temperature control. Furthermore, since the SQUID sensor 80 can be miniaturized, scanning ability can be added.

Ideally, the two-coil method requires that the sample subject to measurement be an infinite film which has zero edge current as one of its key features. The edge current rapidly decreases as the distance between drive coil 20 and film (60) edge increases. Therefore it is favorable to have sufficiently larger lead film 50 and YBCO film 60 than the coils (10, 20). If the film (50, 60) size is limited, however, then the best solution is to remove the edge current. There are two important issues related to the removal of edge current of finite size film. First, the accuracy relevant to geometry such as the film (50, 60) size and the positioning of films (50.60) relative to drive coil 20 is greatly improved. At zero edge current, the magnetic filed at the film edge becomes parallel to the film surface causing M to be insensitive to small errors in the film (50,60) size and the transverse positioning of films (50.60). Second, the smooth distribution of screening current density $J_s$, at the film edge renders the application of Pippard's analytic formula to be more precise. [Refer to: A. B. Pippard, *Supercon. Sci. Tech.*, vol. 7, 696–699(1994)] The only place where the spatial distribution of $J_s$ or the magnetic field sharply changes is at the film edge. Thus, by making the edge current zero, both the distribution of $J_s$, and magnetic field are closer to those of an infinite film. The present invention also devised a method to remove the edge current in a finite film.

The removal of peak in $J_s$ at the film edge is achieved by the drive coil containing fewer counter-winding turns on the top than that the bottom section which is closer to the film and this is depicted in FIG. 1A. The bottom section (a) of the drive coil (20) is wound up 60 times with a 0.1 mm thick magnet wire and the top section (b) is wound up 45 times in the opposite direction. Thus, the drive coil 20 is at a superposition of dipole coil and quadrupole coil components in optimum proportion. Receive coil 10 is composed of a single dipole coil of 105 turns and its winding heights is 1.7 mm.

Figure 3A:
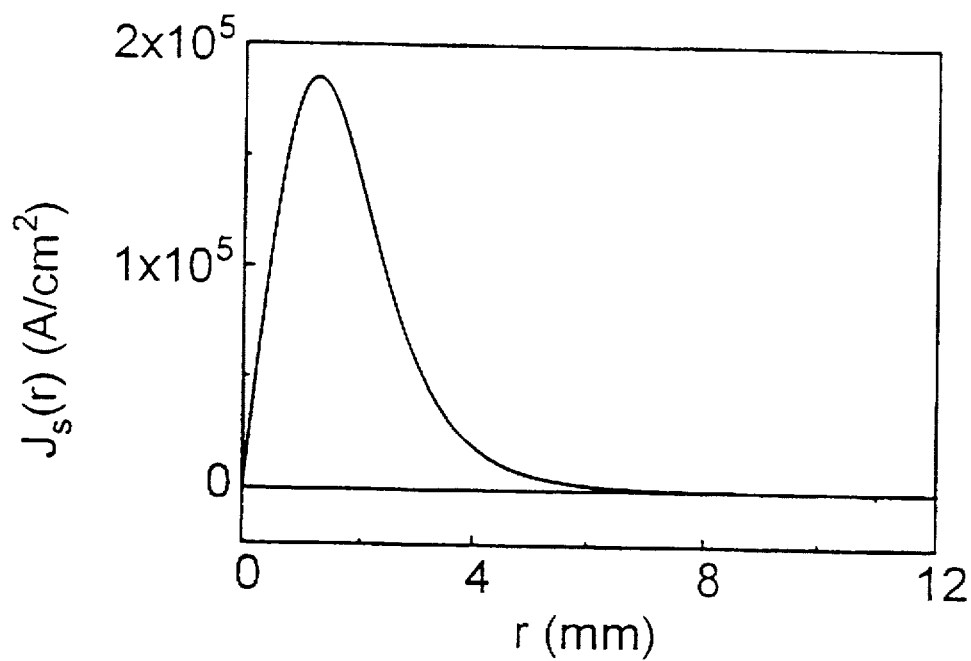
Figure 3B:
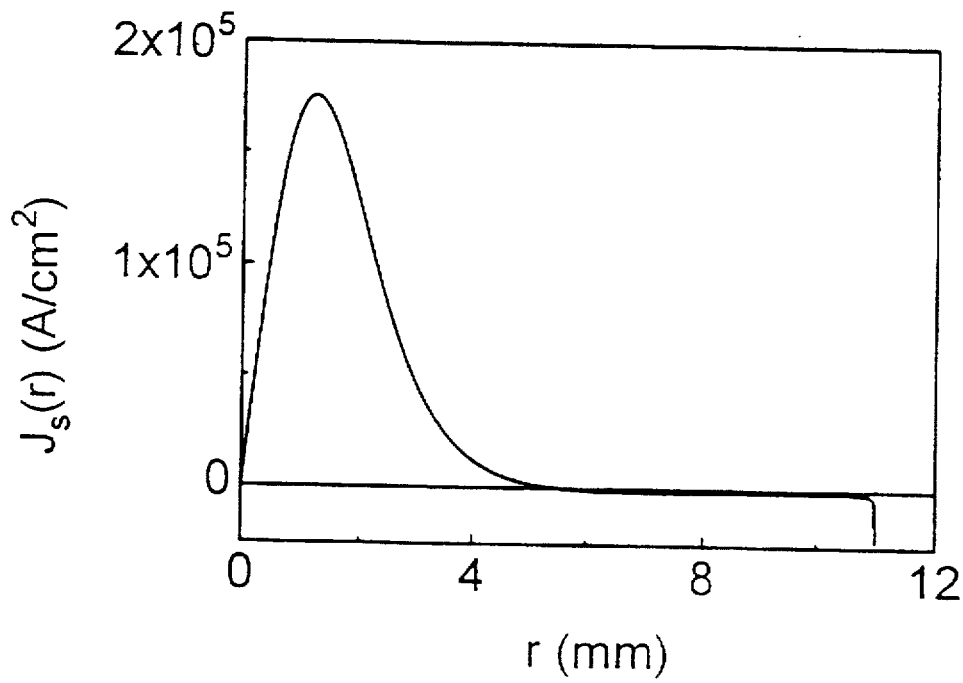

FIG. 3A and 3B are the result of computer simulation showing the radial dependence of screening current density $J_s(r)$ for λ=2000 Å on the circular film having a radius of 11 mm and a thickness of 1000 Å, where "r" denotes the radius from the center of the film. The current $I_d$ at the drive coil for both FIG. 3A and 3B is 82 mA.

FIG. 3A shows the graph of $J_s(r)$ when drive coil 20 in FIG. 1 is adopted. Referring to FIG. 3A, it appeared that the screening current at the film edge is near zero. FIG. 3B shows the graph $J_s(r)$ when the quadrupole coil in which the coil is wound in the top and bottom sections 60 times, respectively, ion opposite direction to each other i adopted as a drive coil of the two-coil apparatus. Referring to FIG. 3B it appeared that the downward peak of the screen $J_s(r)$ of the film edge occurs.

Namely, according to the above-mentioned graphs, it appeared that so as to remove the edge current of the film edge, as shown in FIG. 3A, the drive coil 20 should be composed of a laminated quadrupole coil and dipole coil components.

Computer simulation confirms that the drive coil 20 significantly reduces the error in M propagated from the error in film (6) size and the error in the transverse positioning of film 60, resulting with net improvement in accuracy. The value of M for λ=2000 Å and d=1000 Å are 40 ph (pico henry) and 42 ph for film (60) radius of 10.5 mm and 11.5 mm, respectively, when the drive coil 20 is applied, whereas, M are −45 ph and −15 ph when the drive coil 20 is replaced by the above-mentioned quadrupole coil. M is almost equally susceptible to vertical positioning of the film for both the drive coil 20 and the above-mentioned quadrupole coil type drive coil. M changes by approximately 5 ph as the distance between the nearest turn of drive coil and the film changes from 1.6 mm to 1.4 mm. Since M becomes insensitive to the error in the film size and the transverse position of the film as a result of the removal of the screening current at the film edge, the net accuracy in the measurement is enhanced Once the size of the step height in FIG. 2 is determined, the corresponding value of λ is found based on the relationship between the step height and λ as shown by the solid curve in FIG. 4. The size of step height in FIG. 2 is 36 pico henry and it amounts to 1700 Å as indicated by the solid line in FIG. 4.

Figure 4:
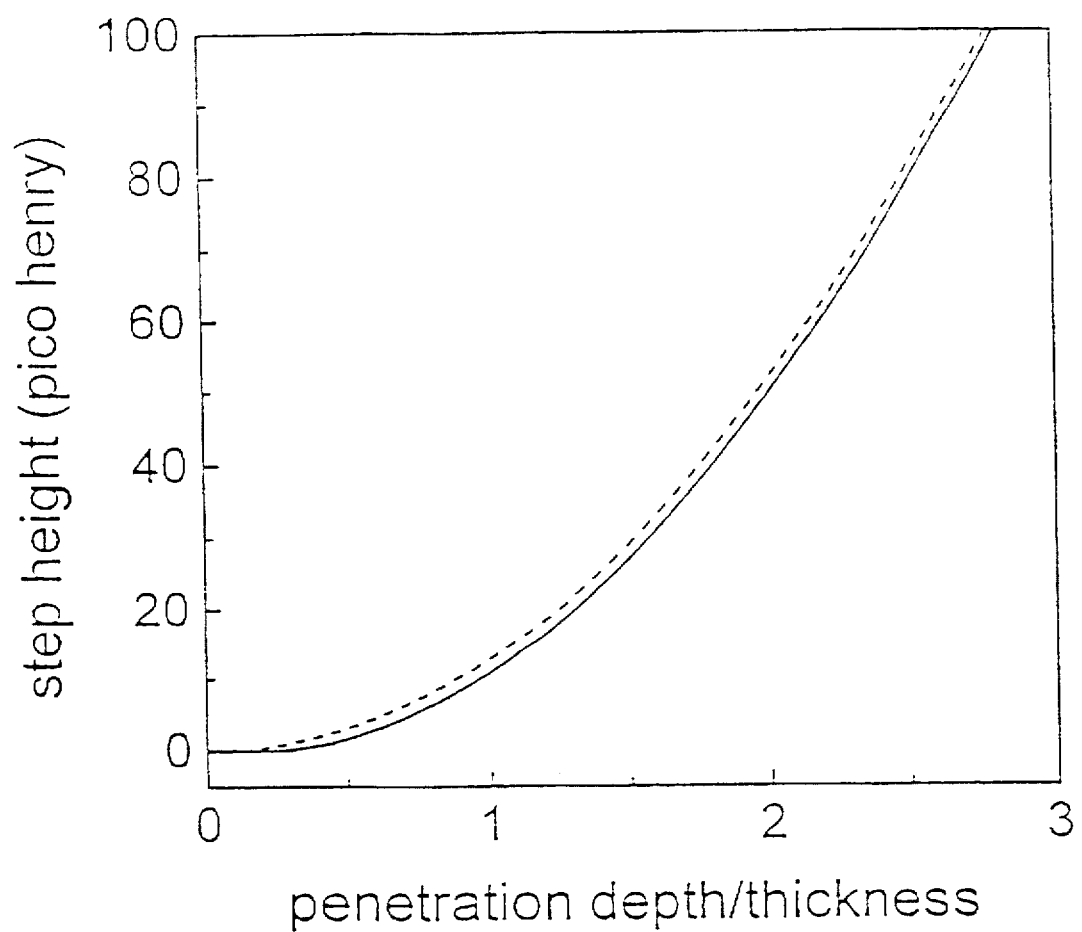
FIG. 4 is a graph showing the template curve for the present invention to convert the measured step height in FIG. 2 into magnetic penetration depth $\lambda$.

In the range $d_s \ll \lambda \ll R$ where $d_s$ is the thickness of sample film and R is the effective radius of the two coil system which is of the order of the radius of coil, the step height denoted as M is given by $$M/M_e = 2\lambda^2/d_s R \quad (1)$$

as shown by dashed line in FIG. 4, where $M_e$ is the empty coil inductance. R is determined numerically with the size of coils, size of film and the distance between coils and film as the input parameters of the numerical calculation. For $\lambda \ll d_s$ regime, M has an exponential dependence in depth profile as given by the expression $$M/M_e = R \exp(-d_s/\lambda)/2 \quad (2)$$

since magnetic field inside a superconductor should decay exponentially in depth with characteristic length scale of λ. M remains virtually zero until the threshold $\lambda/d_s = 0.2$ is reached as shown by the solid line in FIG. 4. The smooth connection between the parabolic λ− dependence of equation 1 for $d_s \ll \lambda$ and the exponential dependence of equation 2 for $d_s \gg \lambda$ is given by the expression $$M/M_e = \{\cosh(d_s/\lambda) + (R/2\lambda)\sinh(d_s/\lambda)\}^{-1} \quad (3)$$

which is shown by the solid line in FIG. 4. If was originally given for the film of infinite size. [Refer to: J. H. Claasen et al., *Phys. Rev.* B, vol. 44, 9605–9608(1991); A. B. Pippard, *Supercon. Sci. Tech.*, vol. 7, 696–699(1994)] In the present invention, equation 3 is used as a good approximation since the edge current of finite film is removed.

As described above in detail, the present invention renders the absolute value of magnetic penetration depth of a large area HTS film to be obtained by measuring the background signal and removing the peak in the screening current at the film edge . The former is achieved by over-lapping the HTC film with a lead film which is equivalent in size and whose thickness is larger than 5 times its penetration depth yet much smaller than the normal states skin depth to measure the background signal and the latter is by designing the drive coil to be at the optimum superposition of dipole coil and quadruple coil components.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. In a two-coil apparatus for measuring the absolute value of magnetic penetration depth of a large area high temperature superconductor (HTS) film, said two-coil apparatus comprising:

a drive coil;

a receive coil opposingly spaced-apart from the drive coil;

sample holders disposed at the left- and right-sides of the receive coil;

a large area low temperature superconductor film attached on the sample holder between the drive coil and the receive coil; and a large area high temperature superconductor film attached on the large area low temperature superconductor film between the drive coil and the receive coil.

2. The two-coil apparatus according to claim 1, wherein said large low temperature superconductor film is formed by one selected from the group comprising Pb, Nb, and a high temperature superconductor material having a lower transition temperature than that of the large area high temperature superconductor film.

3. The two-coil apparatus according to claim 1, wherein said large area low temperature superconductor film has a predetermined thickness which is greater than five times the magnetic penetration depth of the same material in superconductive state, and smaller than 1/100 of skin depth of the same material in the normal metal state.

4. The two-coil apparatus according to claim 1, wherein said large area low temperature superconductor film is coated with a photoresist on the surface of the same.

5. The two-coil apparatus according to claim 1, wherein said sample holder is formed of non-conducting material.

6. The two coil apparatus according to claim 1, wherein said drive coil is composed of a top section coil and a bottom section coil, said drive coil further comprises dipole coil and quadrupole coil components in predetermined proportion which is determined to suppress the screening current of the film at the film edge.

7. The two-coil apparatus according to claim 6, wherein said bottom section coil is wound in an opposite direction than said top section coil, and said bottom section coil is wound with a different number of revolutions than said top section coil.

8. The two-coil apparatus according to claim 1, wherein when a direct magnetic field is adopted instead of an alternating magnetic field, a SQUID sensor is used in the two-coil apparatus instead of the receive coil.

9. The two-coil apparatus according to claim 8, wherein said large area low temperature superconductor film has a predetermined thickness which is determined to have more than five times the magnetic penetration depth in the superconductive state.

10. The two-coil apparatus according to claim 8, wherein said sample holder is formed of a metallic material.

* * * * *